(12) United States Patent
Nadd

(10) Patent No.: US 6,897,682 B2
(45) Date of Patent: May 24, 2005

(54) MOSGATE DRIVER INTEGRATED CIRCUIT WITH ADAPTIVE DEAD TIME

(75) Inventor: Bruno C. Nadd, Lourmarin (FR)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/456,686

(22) Filed: Jun. 5, 2003

(65) Prior Publication Data

US 2004/0041619 A1 Mar. 4, 2004

Related U.S. Application Data

(60) Provisional application No. 60/387,093, filed on Jun. 6, 2002.

(51) Int. Cl.$^7$ ............................................. H03K 19/0175
(52) U.S. Cl. .......................................... 326/83; 326/27
(58) Field of Search ............................... 326/26, 27, 82, 326/83, 86

(56) References Cited

U.S. PATENT DOCUMENTS

| | | | | |
|---|---|---|---|---|
| 5,541,541 A | * | 7/1996 | Salamina et al. | 327/108 |
| 6,294,954 B1 | * | 9/2001 | Melanson | 330/10 |
| 6,696,861 B1 | * | 2/2004 | Baldwin et al. | 326/83 |

* cited by examiner

Primary Examiner—Don Le
(74) Attorney, Agent, or Firm—Ostrolenk, Faber, Gerb & Soffen, LLP (57) ABSTRACT

A MOS-gated circuit, including a plurality of gated switches; and a driver circuit electrically coupled to the gated switches, the driver circuit configured to automatically prevent a simultaneous conduction of the gated switches if at least one of the gated switches is not capable of sustaining a reapplied voltage without conducting.

10 Claims, 7 Drawing Sheets

MOSGATE DRIVER INTEGRATED CIRCUIT WITH ADAPTIVE DEAD TIME

RELATED APPLICATIONS

The present application is based on and claims the benefit of U.S. Provisional Application Ser. No. 60/387,093, filed on Jun. 6, 2002, entitled MOSGATE DRIVER INTEGRATED CIRCUIT WITH ADAPTIVE DEAD TIME, the entire contents of which are expressly incorporated herein by reference.

FIELD OF THE INVENTION

This invention relates to driver circuits for gated switching devices, for example, a MOSgate driver circuit for driving first and second series connected MOS-gated devices.

BACKGROUND OF THE INVENTION

Figure 1:
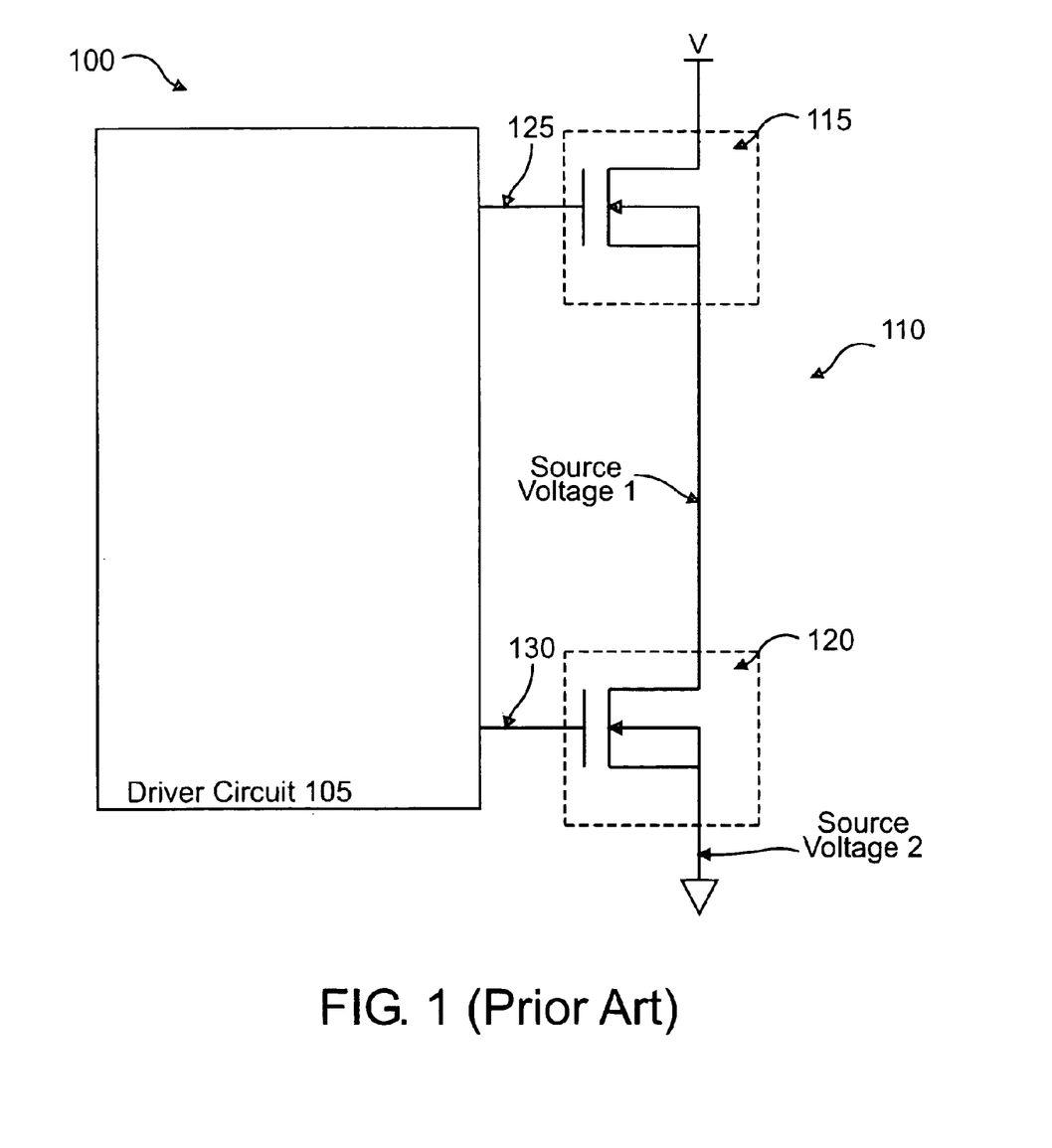
FIG. 1 shows a driver circuit according to the prior art.

With respect to various applications (e.g., integrated circuit applications), it is known to employ driver circuits for driving at least two gated switches, for example, at least two gated power switches and/or power MOSgated devices (e.g., MOSFETs, IGBTs, GTO Thyristors, etc.). Referring now to FIG. 1, there is seen an exemplary MOS-gated circuit 100 according to the prior art. MOS-gated circuit 100 includes first and second gated switches 115, 120 electrically coupled to one another in series, as well as a driver circuit 105 configured to control the conduction states of gated switches 115, 120 via respective gate output signals 125, 130, such that only one of gated switches 115, 120 conducts at any given time. Such circuits are commonly used, for example, in bridge legs for motor drives and the like.

Figure 2:
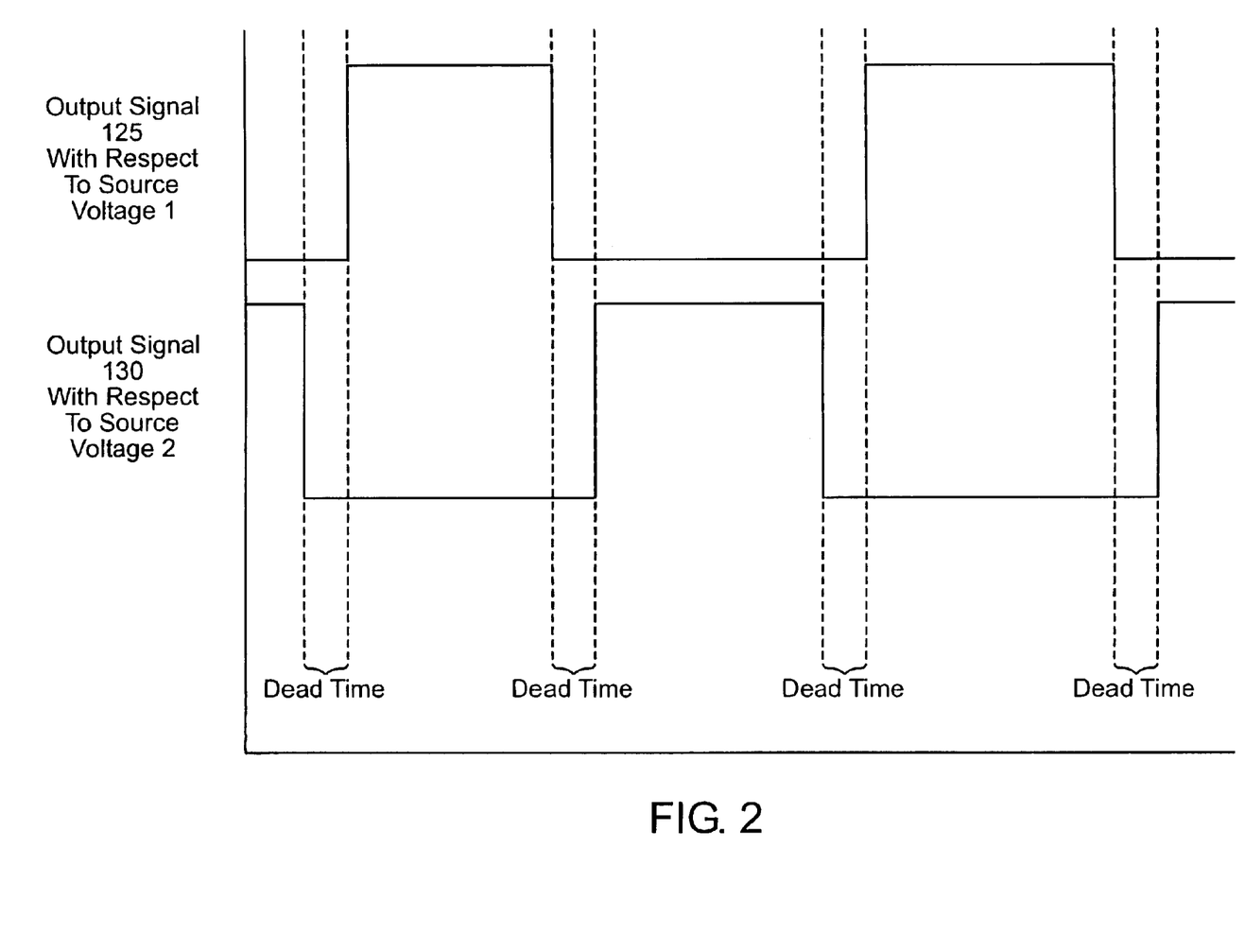
FIG. 2 is a timing diagram showing anti-phase control of the driver circuit of FIG. 1.

Referring now to FIG. 2, there is seen an exemplary timing diagram showing the turn-on and turn-off times of respective gate output signals 125, 130 for the conventional MOS-gate driver circuit of FIG. 1. Respective output signals 125, 130 are controlled in anti-phase, such that only one of gated switches 115, 120 conducts at any given time.

In actual applications, however, gated switches 115, 120 may be incapable of immediately switching from a conductive state to a non-conductive state in response to respective output signals 125, 130. That is, inherent gate capacitances may result in associated turn-off delay times, during which gated switches 115, 120 remain conductive after receiving turn-off commands from driver circuit 105. Thus, the ideal "anti-phase" control may not prevent simultaneous conduction of gated switches 115, 120. As such, it is known to intentionally provide a "dead-time" after turning off either of gated switches 115, 120, the dead-time being larger than the longest turn off delay of gated switches 115, 120 (e.g., between 1 and 3 S). During this dead-time, neither of gated switches 115, 120 is controlled to conduct, as shown in FIG. 2.

Although these measures may prevent simultaneous conduction of gated switches 115, 120, the additional dead-time reduces the maximum duty cycle and the modulation depth of the Pulse Width Modulated (PWM) control of gated switches 115, 120. For example, with respect to a carrier frequency of 20 khz (Period=50 $\mu$S) and a 3 $\mu$S dead-time, the maximum duty cycle is:

1−3/50=94%.

SUMMARY OF THE INVENTION

It is an object of the present invention to provide a MOS-gated driver circuit capable of overcoming the disadvantages of prior art driver circuits described above. For this purpose, the present invention proposes a MOS-gated circuit capable of automatically controlling the dead-time in a closed loop to prevent the simultaneous conduction of MOS-gated switches, such as MOSFETs or IGBTs. The dead-time determination is based on the status of each switch (e.g., the ability of each switch to withstand a reverse voltage before the other switch can turn on). In this manner, the shortest possible dead-time can be automatically provided. Any desired characteristic may be monitored, for example, gate-to-source voltage, to determine when the MOS-gated device is capable of withstanding a reapplied voltage.

In one exemplary embodiment, an adaptive dead time circuit is provided for first and second series connected MOS-gated devices configured to conduct sequentially, but not simultaneously. The circuit includes first and second monitor circuits coupled to the MOS-gated devices configured to produce respective output signals in response to the measurement of a characteristic of the first and/or second MOS-gated devices related to their ability to withstand a reapplied voltage. The output signals of the first and second monitor circuits are respectively connected to the gate electrodes of the MOS-gated devices to enable their turn on in response to an output signal from said first and second monitor circuits, respectively; whereby simultaneous conduction of the first and second MOS-gated devices is prevented and the dead-time between their conduction sequences is minimized.

DETAILED DESCRIPTION

Figure 4:
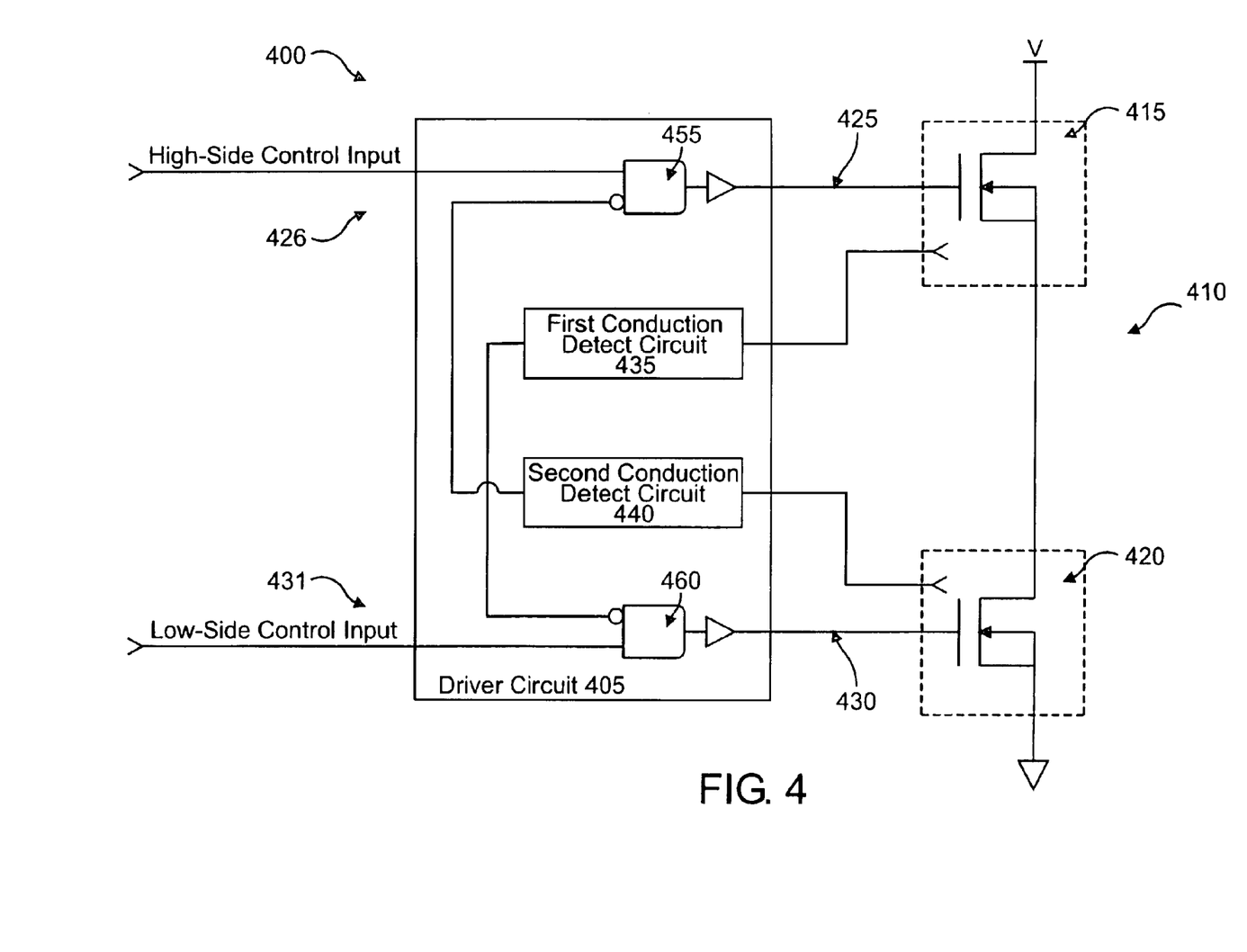
FIG. 4 shows an exemplary MOS-gated circuit according to the present invention.

Referring now to FIG. 4, there is seen an exemplary MOS-gated circuit 400 according to the present invention. MOS-gated circuit 400 includes a bridge leg 410 (or other circuit component) having first and second gated switches 415, 420 electrically coupled to one another in series, as well as a driver circuit 405 for controlling the conduction state of gated switches 415, 420. For this purpose, driver circuit 405 generates respective output signals 425, 430, which are controlled in accordance with high-side and low-side control inputs 426, 431 to control the conduction states of gated switches 415, 420, respectively.

Although FIG. 4 shows a MOS-gated circuit 400 configured to control the conduction states of two gated switches 415, 420 of bridge leg 410, it should be appreciated that MOS-gated circuit 400 may be employed to control any number of gated switches in any configuration, such as, for example, four gated switches in an H-bridge configuration.

Figure 3:
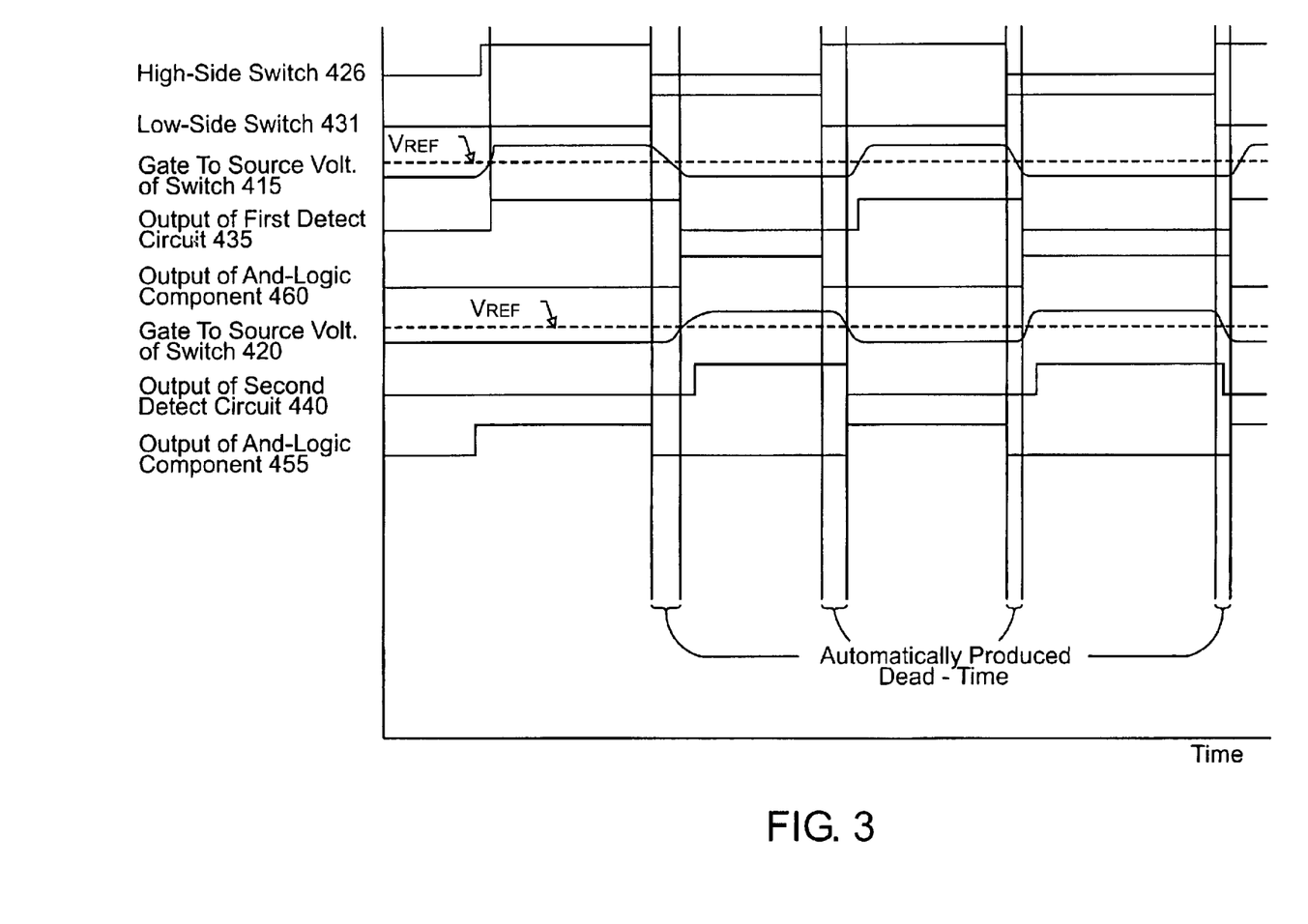
FIG. 3 is a timing diagram showing anti-phase control of an exemplary MOS-gated circuit according to the present invention.

To prevent simultaneous conduction of gated switches 415, 420, driver circuit 405 includes first and second conduction detect circuits 435, 440 respectively assigned to each of gated switches 415, 420. Conduction detect circuits 435, 440 are configured to generate conduction detect signals 445, 450 in accordance with whether their associated gated switches 415, 420 are capable of sustaining a reapplied voltage without conducting. Each conduction detect signal 445, 450 forms one input of a respective AND-logic component 455, 460, with the other input being formed by a respective one of high-side and low-side control inputs 426, 431. In this manner, if a selected one of gated switches 415, 420 is not capable of sustaining a reapplied voltage without conducting, the conduction detect circuit 435, 440 assigned to that switch 415, 420 prevents the other one of switches 415, 420 from conducting. That is, conduction detect circuits 435, 440 automatically produce appropriate dead-times to prevent simultaneous conduction of gated switches 415, 420, as shown in the timing diagram of FIG. 3.

By providing conduction detect circuits 435, 440 in accordance with the present invention, a circuit designer need not precisely calculate the worst case dead time, since detect circuits 435, 440 self-adjust to the conduction characteristics of gated switches 415, 420. In this manner, it may be better ensured that gated switches 415, 420 operate with the minimum dead time.

Figure 5:
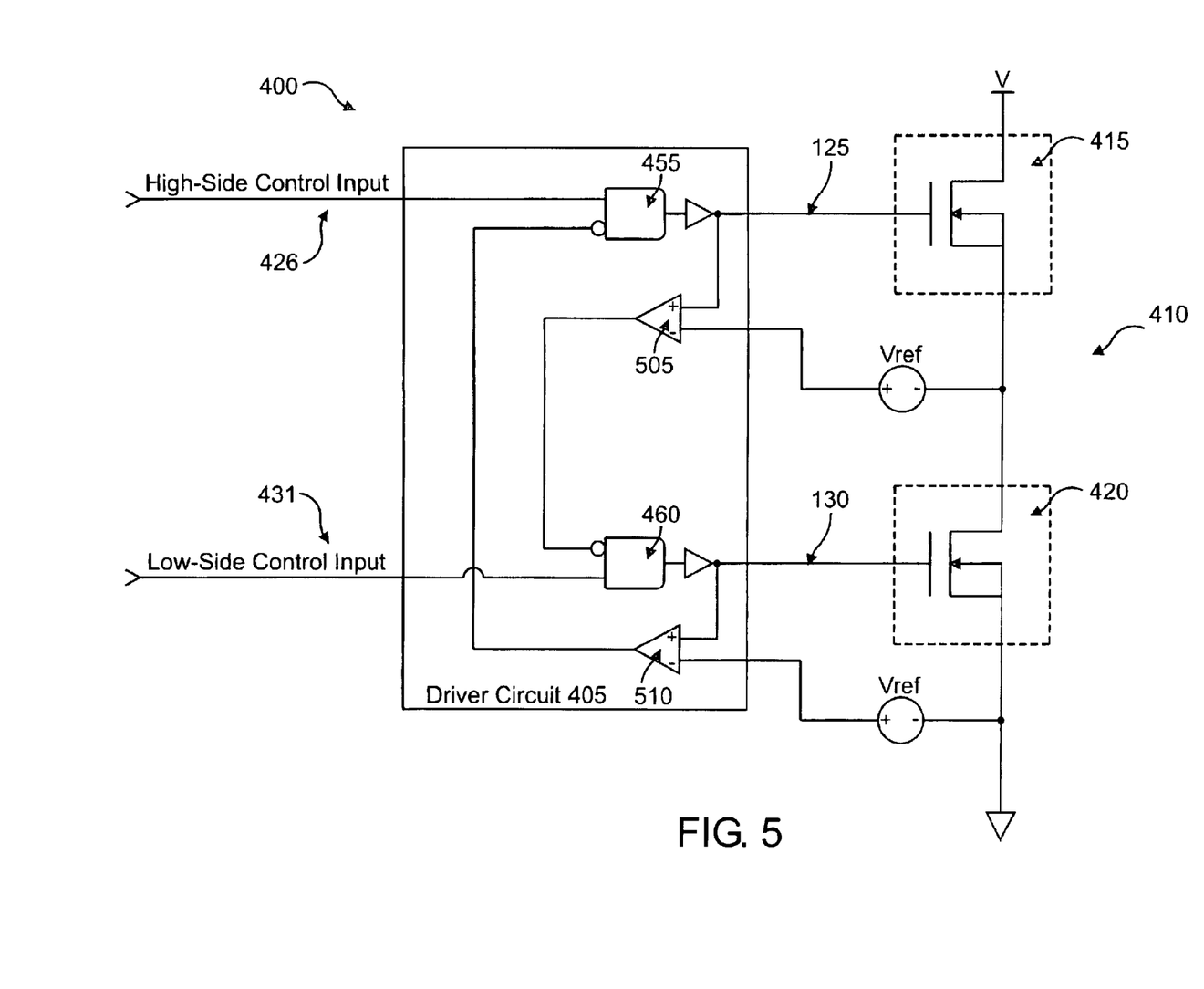
FIG. 5 shows a variant of the exemplary MOS-gated circuit of FIG. 4.

Referring now to FIG. 5, there is seen another exemplary MOS-gated circuit 500, in which the conduction detect circuits 435, 440 include respective comparators 505, 510 configured to produce output signals in accordance with the difference between the gate-to-source voltage of their assigned switch 415, 420 and a reference voltage ($V_{REF}$), which may be selected to be at or below the threshold voltages of switches 415, 420. For this purpose, the positive inputs of comparators 505, 510 are connected to the gates of their respectively assigned gated switches 415, 420, and the negative inputs of comparators 505, 510 are connected to reference voltage ($V_{REF}$). In this manner, each of comparators 505, 510 produces its output signal in accordance with whether its assigned switch 415, 420 is capable of sustaining a reapplied voltage without conducting.

The various exemplary embodiments of the present invention described above may be applied to driver circuits operable to control IGBT switches. However, since IGBT switches are minority carrier devices, it takes time for minority carriers in the epitaxial layer of the IGBTs to decay after turn-off. As such, detecting whether the gate-to-source voltage of an IGBT is below a predetermined reference voltage may not guarantee that an IGBT switch is capable of sustaining a reapplied voltage without conducting.

Figure 6:
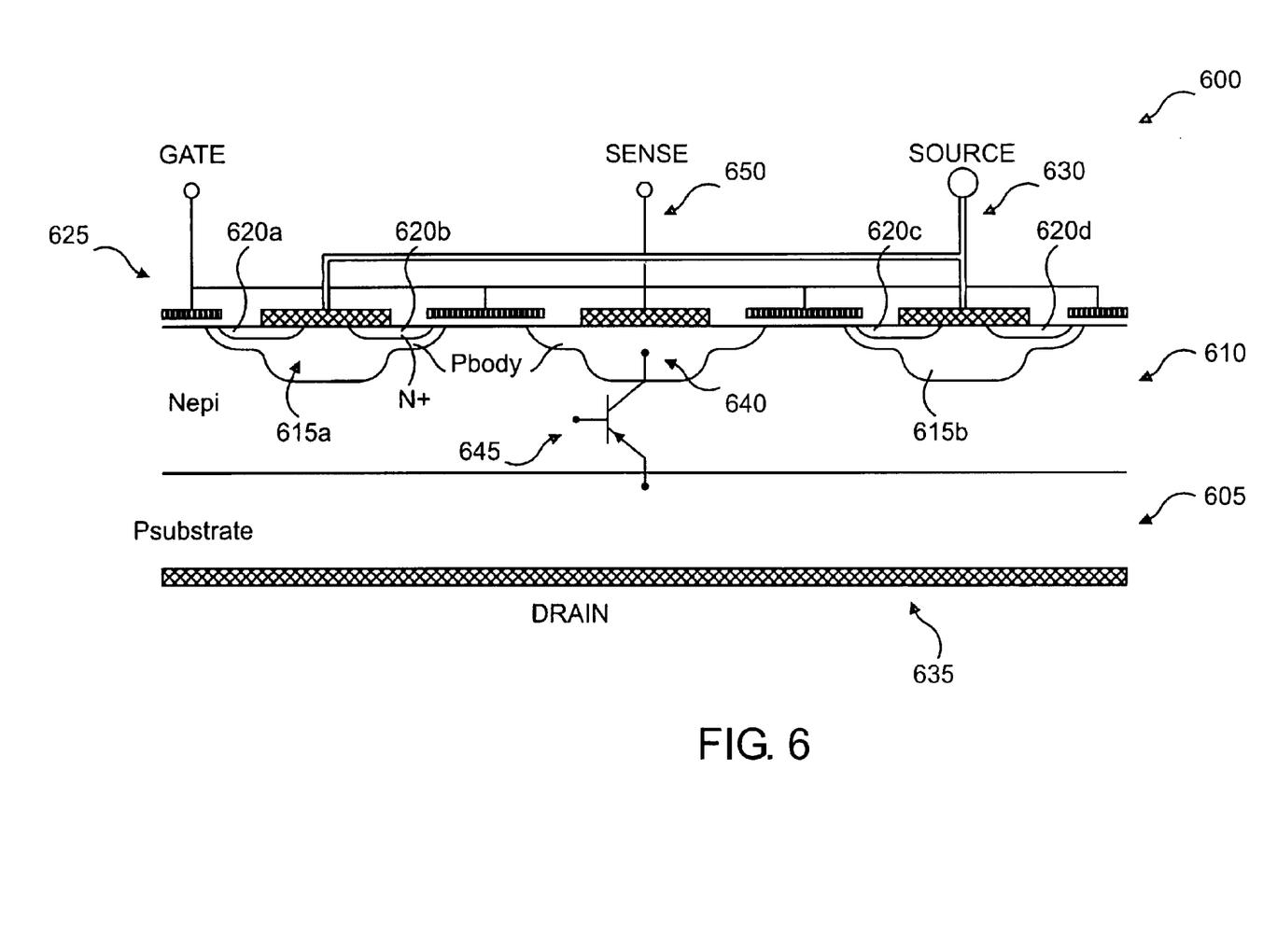
FIG. 6 shows an exemplary IGBT switch according to the present invention including a sense electrode for detecting minority carriers.

Referring now to FIG. 6, there is seen an exemplary IGBT switch 600 according to the present invention capable of permitting external circuitry to detect the presence of minority carriers in the epitaxial layer of the IGBT switch. As is known, IGBT switch 600 includes a P substrate 605, upon which is grown an N− epitaxial layer 610, P doped body diffusions 615a, 615b, N+ diffusions 620a, 620b, 620c, 620d, a gate electrode 625, a source electrode 630, and a drain electrode 635 on the bottom surface of P substrate 605. However, unlike the prior art, IGBT switch 600 includes an additional P diffusion 640 (e.g., a P-diffusion 640 for N type IGBT 600) according to the present invention. The additional P diffusion forms the collector of a vertical bipolar device 645 (e.g., a PNP bipolar transistor 645 in N type IGBT 600), with a sense electrode 650 being electrically coupled to the additional P diffusion (collector) 640. In this manner, the presence of minority carriers in the N− epitaxial layer may be detected by measuring the voltage drop across the sense electrode 650 and the drain electrode 635, thereby providing a more reliable measure as to whether the IGBT 600 is capable of sustaining reapplied voltage without conducting.

Figure 7:
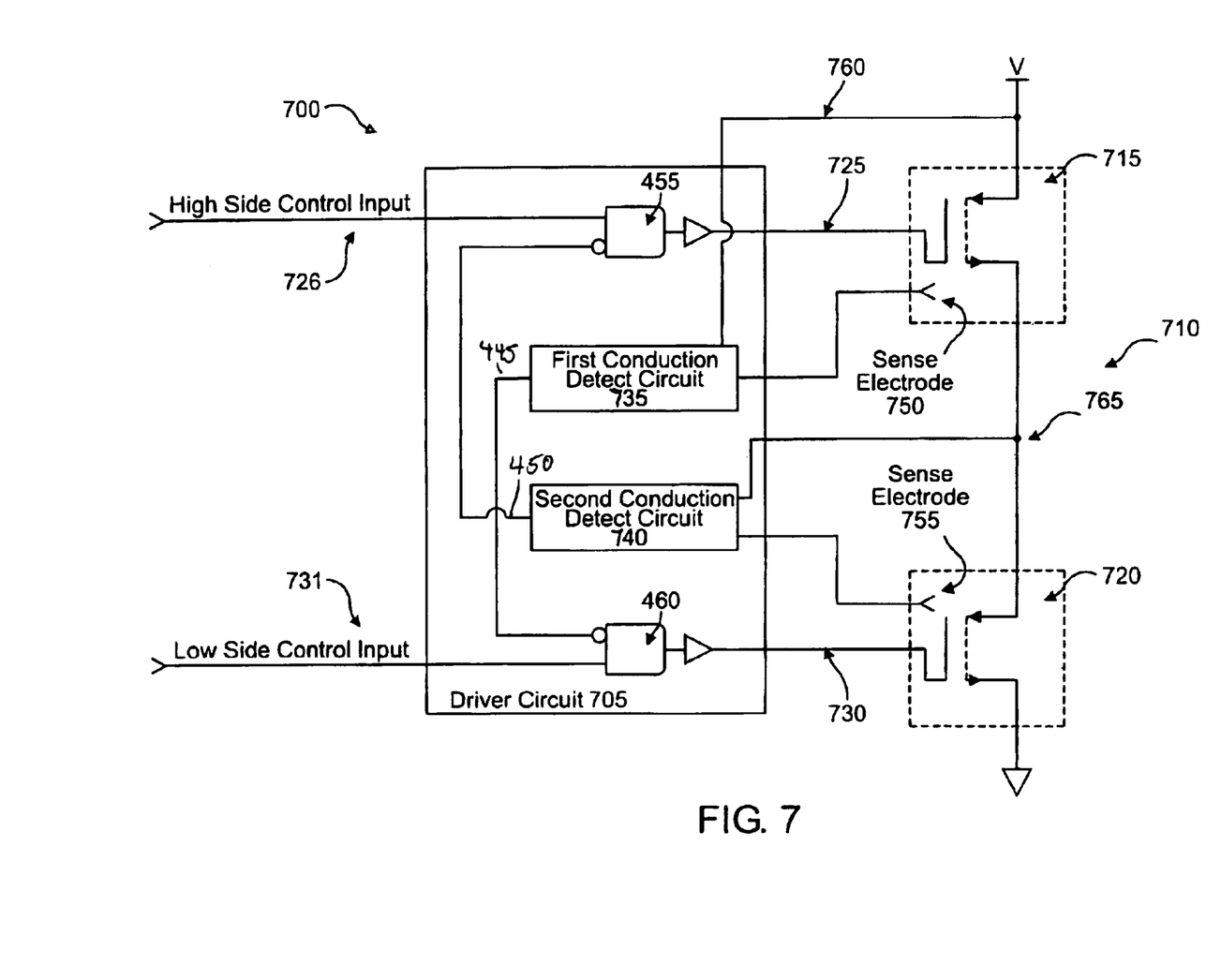
FIG. 7 shows an exemplary IGBT driver circuit according to the present invention for controlling a plurality of IGBT.

Referring now to FIG. 7, there is seen an exemplary IGBT driver circuit 700 according to the present invention for controlling at least one IGBT switch of FIG. 6. IGBT driver circuit 700 includes a bridge leg 710 having first and second IGBT switches 715, 720 electrically coupled to one another in series, as well as a driver circuit 705 for controlling IGBT switches 715, 720. Similar to the exemplary embodiments described above, driver circuit 705 is configured to control the conduction states of IGBT switches 715, 720 via respective output signals 725, 730, which are controlled in accordance with high-side and low-side control inputs 726, 731 for controlling the conduction states of IGBT switches 715, 720, respectively.

To prevent simultaneous conduction of IGBT switches 715, 720, driver circuit 705 includes first and second conduction detect circuits 735, 740 respectively assigned to each of IGBT switches 715, 720. Conduction detect circuits 740 are configured to generate conduction detect signals 445, 450 in accordance with whether their associated gated switches 715, 720 are capable of sustaining a reapplied voltage without conducting. For this purpose, detect circuits 735, 740 measure the voltage across the sense electrodes 750, 755 and drain electrodes 760, 765 of their respectively assigned IGBT switches 715, 720. In this manner, if a selected one of IGBT switches 715, 720 is not capable of sustaining a reapplied voltage without conducting, the conduction detect circuit 735, 740 assigned to that switch 715, 720 prevents the other one of switches 715, 720 from conducting.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A MOS-gated circuit, comprising:
   a plurality of gated switches; and
   a driver circuit electrically coupled to the gated switches, the driver circuit including a plurality of conduction detect circuits electrically coupled to the gated switches, respectively, each of the conduction detect circuits configured to detect a characteristic of an assigned gated switch related to whether the assigned switch is in a conducting state;
   wherein the driver circuit automatically prevents a simultaneous conduction of the gated switches if the assigned gated switch is in the conducting state, further wherein each of the conduction detect circuits includes a comparator configured to produce an output signal in accordance with a difference between a gate-to-source voltage of the assigned gated switch and a reference voltage, the output signal communicating whether the assigned gated switch is in a conducting state.

2. The circuit according to claim 1, wherein the reference voltage is selected to be below a turn-on threshold voltage of the assigned gated switch.

3. The circuit according to claim 1, wherein the driver circuit includes a plurality of AND-logic components respectively assigned to and electrically coupled to the gated switches, each of the AND-logic components including a first input electrically coupled to the output signal of a respective one of the conduction detect circuits, each of the AND-logic components including a second input electrically coupled to a control input.

4. The circuit according to claim 1, wherein the plurality of gated switches includes a first gated switch and a second gated switch electrically coupled to one another in series, each of the gated switches including gate, source, and drain electrodes, the driver circuit including a first AND-logic component electrically coupled to and assigned to the first gated switch, a second AND-logic component electrically coupled to and assigned to the second gated switch, a first comparator having an output and positive and negative inputs, the positive input of the first comparator being electrically coupled to the gate electrode of the first gate switch, the negative input of the first comparator being electrically coupled to a first reference voltage, a second comparator having an output and positive and negative inputs, the positive input of the second comparator being electrically coupled to the gate electrode of the second gate switch, the negative input of the second comparator being electrically coupled to a second reference voltage, the output of the first comparator being electrically coupled to the second AND-logic component, the output of the second comparator being electrically coupled to the first AND-logic component, a high-side control input being electrically coupled to the first AND-logic component, a low-side control input being electrically coupled to the second AND-logic component.

5. The circuit according to claim 1, wherein the plurality of gated switches include at least one IGBT switch having an epitaxial layer, an additional diffusion arranged within the epitaxial layer, and a sense electrode electrically coupled to the additional diffusion, the characteristic related to whether the assigned switch is in the conducting state including a voltage of the sense electrode.

6. The circuit according to claim 5, wherein the conduction detect circuit assigned to the IGBT switch detects whether the IGBT switch is in a conducting state by comparing the voltage of the sense electrode with a drain voltage of the IGBT.

7. The circuit according to claim 1, wherein the gated switches include at least one of MOSFETs, IGBTs, and GTO Thyristors.

8. A circuit to control a plurality of gated switches, comprising:
a driver circuit electrically coupled to the gated switches, the driver circuit including a plurality of conduction detect circuits electrically coupled to the gated switches, respectively, each of the conduction detect circuits configured to detect a characteristic of an assigned gated switch related to whether the assigned switch is in a conducting state;

wherein the driver circuit automatically prevents a simultaneous conduction of the gated switches if the assigned gated switch is in the conducting state, further wherein each of the conduction detect circuits includes a comparator configured to produce an output signal in accordance with a difference between a gate-to-source voltage of the assigned gated switch and a reference voltage, the output signal communicating whether the assigned gated switch is in a conducting state.

9. An adaptive dead time circuit to control first and second series connected MOS-gated devices configured to conduct sequentially, but not simultaneously, the adaptive dead time circuit comprising:
first and second monitor circuits coupled to the MOS-gated devices, the monitor circuits being configured to produce respective output signals in response to a measurement of a characteristic of the first and second MOS-gated devices related to their ability to withstand a reverse voltage, the output signals of the first and second monitor circuits being respectively connected to the gate electrodes of the MOS-gated devices to enable their turn-on so that simultaneous conduction of the first and second MOS-gated devices is prevented and the dead-time between their conduction sequences is minimized, further wherein each of the monitor circuits includes a comparator configured to produce an output signal in accordance with a difference between a gate-to-source voltage of a respective MOS-gated device and a reference voltage, the output signal communicating whether the respective MOS-gated device is in a conducting state.

10. A method to prevent the simultaneous conduction of a plurality of gated switches, the method comprising:
detecting whether at least one of the gated switches is not capable of sustaining a reapplied voltage without conducting; and automatically preventing a simultaneous conduction of the gated switches if the at least one of the gated switches is not capable of sustaining the reapplied voltage without conducting, said step of detecting comprising providing a plurality of conduction detect circuits electrically coupled to the gated switches, respectively, each of the conduction detect circuits configured to detect a characteristic of an assigned gated switch related to whether the assigned switch is in a conducting state;

further comprising, for each of the conduction detect circuits, producing an output signal in accordance with a difference between a gate-to-source voltage of the assigned gated switch and a reference voltage, the output signal communicating whether the assigned gated switch is in a conducting state.

* * * * *